United States Patent [19]

Kojima et al.

[11] Patent Number: 4,684,893
[45] Date of Patent: Aug. 4, 1987

[54] FIELD GRADIENT CORRECTION APPARATUS FOR COMPENSATING STATIC FIELD INHOMOGENEITIES IN NMR IMAGING SYSTEM

[75] Inventors: Fumitoshi Kojima; Mitchio Mitomi, both of Otawara, Japan

[73] Assignee: Kabushiki Kaisha Toshiba, Kawasaki, Japan

[21] Appl. No.: 812,847

[22] Filed: Dec. 23, 1985

[51] Int. Cl.$^4$ ............................................. G01R 33/20
[52] U.S. Cl. .................................... 324/312; 324/309
[58] Field of Search ............... 324/320, 312, 309, 307, 324/313

[56] References Cited

U.S. PATENT DOCUMENTS 4,284,950  8/1981  Burl et al. ............................ 324/320
4,585,992  4/1986  Maudsley et al. .................. 324/320
4,616,183 10/1986  Glover et al. ....................... 324/309

Primary Examiner—Stewart J. Levy
Assistant Examiner—Kevin D. O'Shea
Attorney, Agent, or Firm—Schwartz, Jeffery, Schwaab, Mack, Blumenthal & Evans

[57] ABSTRACT

Selective excitation is used to excite to resonance nuclear spins in a predetermined planar slice of a target. The received NMR signals are then used to correct non-homogenity of a static magnetic field based upon the calculated spin-spin relaxation time $T_2^*$ of the observed NMR signal.

4 Claims, 8 Drawing Figures

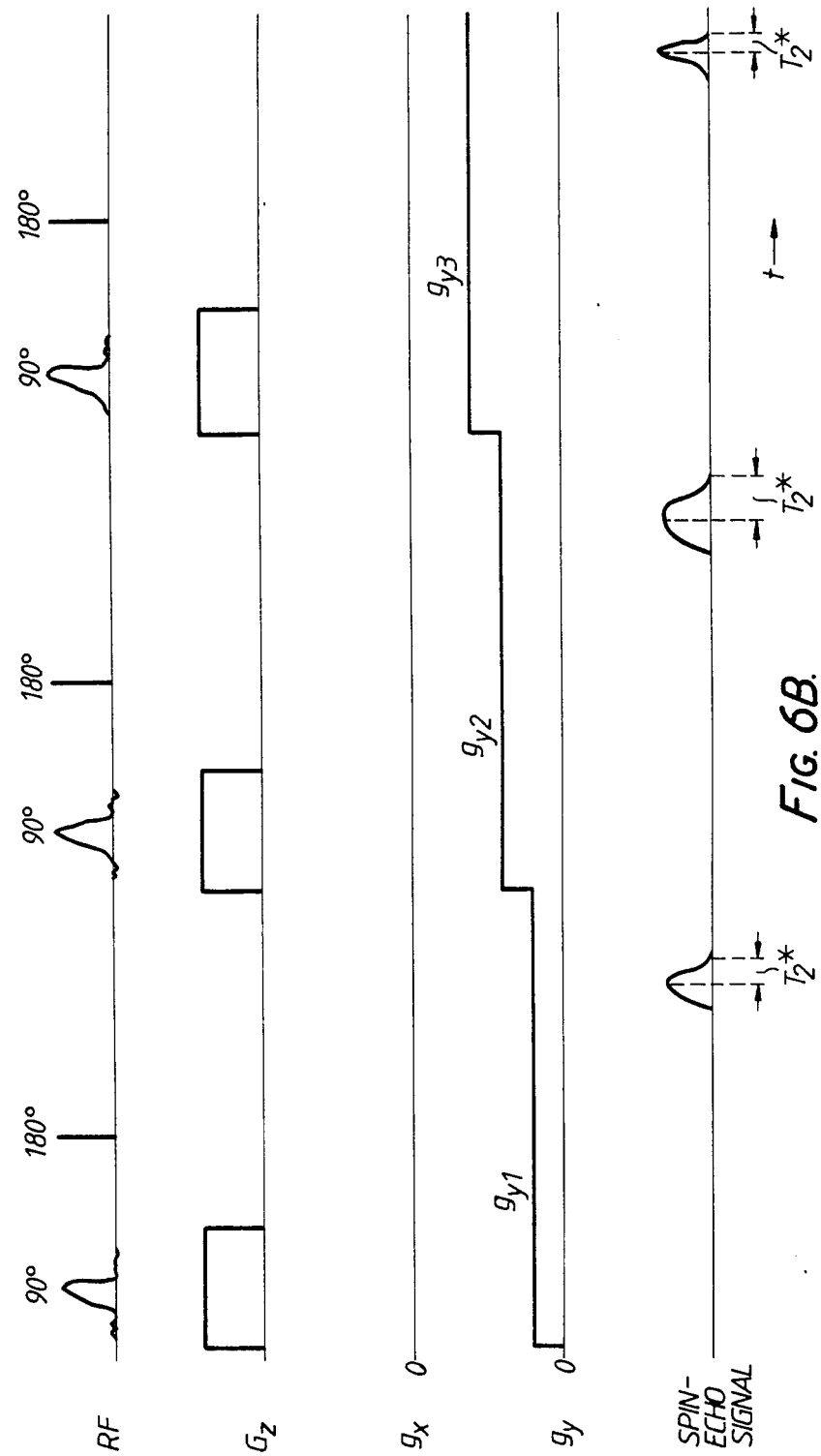

FIELD GRADIENT CORRECTION APPARATUS FOR COMPENSATING STATIC FIELD INHOMOGENEITIES IN NMR IMAGING SYSTEM

BACKGROUND OF THE INVENTION

This invention relates to an apparatus for performing two and/or three-dimensional nuclear magnetic resonance (NMR) imaging, which imaging is based upon a function of the spin density distribution, the spin-lattice relaxation time ($T_1$) and the spin-spin relaxation time ($T_2$) of particular protons within a target. More specifically, the invention relates to a NMR imaging method and apparatus which compensates for inhomogeneities in the static magnetic field strength.

Atomic nuclei have net magnetic moments when placed in a static magnetic field, $B_0$, at an NMR (Larmor) frequency $\omega$ given by the equation $$\omega = \gamma B_0 \tag{1}$$

in which $\gamma$ is the gyro-magnetic ratio, constant for each NMR isotope. The frequency at which the nuclei precess is primarily dependent on the strength of the magnetic field $B_0$, and increases with increasing field strength.

Many different techniques are currently being investigated by which a characteristic image of a target, which might be part of a patient, can be effectively and efficiently obtained by nuclear magnetic resonance (NMR) imaging. Typically, the characteristic sought to be obtained is some function of the spin density distribution, the spin-lattice relaxation time ($T_1$) and the spin-spin relaxation time ($T_2$) of particular protons within the target. These protons are first excited by application of a magnetic field and a radio frequency (RF) pulse. Protons thus excited tend subsequently to relax, and during the process of relaxing generate a free induction delay (FID) signal. The above characteristic function of the relaxing protons within the target may be obtained by a Fourier transformation of this FID signal. By using the RF pulse being chosen to have a frequency spectrum corresponding to the Larmor frequency of the protons given by the formula $\omega = \gamma B_0$, it is possible to excite protons in a single plane which may be a slice of the patient target.

Various NMR proton imaging techniques have been proposed, which involve four variable (three spatial variables, plus intensity). Such methods are based on two different principles. In one of these the data is gathered from a single localized region at a time so that many localized regions must be individually observed in order to obtain sufficient spatial data to construct an entire image.

More efficient data collection methods have been proposed in which the NMR imaging data is gathered simultaneously from many points, and the data received from the target contain spatial information about different parts of the target. An example of such a method is disclosed by Lauterbur in *Nature*, Vol. 242, Mar. 16, 1973, pages 190–191, in which NMR spectra which results from Fourier transforms of FID signals are derived from the target which is subjected to a magnetic field having a linear field gradient. Each individual spectrum represents a one-dimensional projection of the nuclear spin density in the target, integrated over planes perpendicular to the direction of the gradient. In order to obtain two-dimensional or three-dimensional images, spectra are derived for a series of different directions of the field gradient, and the results are subject to a process of "projection reconstruction".

There are other different imaging methods using a signal coding principle, for example, the Fourier imaging method described by Kumar, Welti and Ernst, "NMR Fourier Zeugmatography", *Journal of Magnetic Resonance* 18, (1975), pp. 69–83. In this reference, the spectral information is encoded by variable amplitude linear field gradients in respective orthogonal directions defining the slice of the target.

In general, NMR imaging apparatus requires a homogeneous field $B_0$ which is stable for a long duration. However, in practice, the static magnetic field intensity may vary significantly in certain circumstance, especially due to drift in the static magnetic field power supply. These changes in magnetic field intensity may be both temporal and spatial and become serious with increasing lapse of time. As understood from the equation $\omega = \gamma B_0$, the frequency of the NMR signal received from the target of course varies in accordance with any variation in the magnetic field intensity, and errors in the magnetic field result in geometrical distortions of the resulting image due to changes in the observed spectra.

Accordingly, it is an object of the invention to provide a method and apparatus for performing nuclear magnetic imaging which enables a reduction in aliasing of the spatial information in the NMR signals due to changes in the static magnetic field $B_0$.

It is another object of the invention to provide a NMR imaging method and apparatus in which inhomogeneities in the magnetic field $B_0$ are corrected by applying field offset gradients determined as a function of the decay time $T_2^*$.

It is still another object of the invention to provide a NMR imaging apparatus without a special stabilization system to maintain the static magnetic field uniform.

SUMMARY OF THE INVENTION

In accordance with the invention, two-dimensional and three-dimensional NMR imaging apparatus operates by controlling the intensity of the static magnetic field by means of an offset magnetic field gradient which is effectively constituted so as to maximize the decay period for the individual echo signals. The spin echo signal is characterized by the parameter $T_2^*$, which is its exponential decay time.

According to the invention, the spin echo signal is observed and its decay $T_2^*$ measured for a plurality of offset field gradients so as to select the offset gradient corresponding to a maximum observed value of $T_2^*$. This selected offset gradient value represents a field gradient which, when added to the static field $B_0$, causes minimum dispersion resulting from spatial inhomogeneities in $B_0$ and is subsequently utilized with the normal encoding gradients to compensate for static field inhomogeneities.

The invention is further characterised by an apparatus for performing nuclear magnetic resonance imaging of an object and compensating for static field inhomogeneities comprising means for applying a static magnetic field to said object along a first axis thereof; means for applying a first magnetic field gradient $G_z$ along a selected one of said first, second and third axes; means for applying second and third mutually orthogonal encoding gradients $G_x$, $G_y$ along directions perpendicular to said selected axis; means for applying radio frequency signals to excite a selected region of said object in a plane perpendicular to said first axis and for providing an NMR spin-echo signal; means for varying the magnitude of at least the $G_x$ and $G_y$ magnetic field gradients for producing a varying orientation of a composite gradient in the plane containing said selected region; means for detecting said NMR spin-echo signal for different orientations of said composite gradient to derive imaging data of said selected regions; means for applying a plurality of magnetic field offset gradients $g_x$ in the direction of $G_x$ while detecting said NMR spin-echo signals in the absence of magnetic field gradients $G_y$; means for applying a plurality of magnetic field gradients $g_y$ in the direction of $G_y$ while detecting said NMR spin-echo signals in the absence of magnetic field encoding gradients $G_x$; means for calculating the decay time $T_2^*$ for each of said plurality of magnetic field offset gradients $g_x$, $g_y$; means for selecting the largest of said calculated values $T_2^*$ for each of said offset gradients $g_x$, $g_y$; means for adjusting the magnetic field offset gradients $g_x$, $g_y$ to correspond to the largest selected values of $T_2^*$ for $g_x$, $g_y$ respectively; and means for adding said offset field gradients $g_x$, $g_y$ to said field gradients $G_x$, $G_y$ for performing NMR imaging.

The invention may also be characterized as a method for NMR image formation which compensates for static magnetic field inhomogeneities on nuclear spin-echo signals comprising the steps of:

(a) applying a gradient field $G_z$ along a chosen one of first, second and third axes of a sample;

(b) applying a static magnetic field $B_0$ along a first axis of a sample;

(c) irradiating said sample with a frequency selective 90° RF pulse so as to excite a plurality of nuclear spins in a predetermined region within said sample;

(d) irradiating said sample with a 180° RF pulse;

(e) applying a field offset gradient g(i) in a selected direction orthogonal to said first axis and having a magnetic field in the direction of said first axis;

(f) detecting a spin-echo signal in the presence of said offset gradient g(i);

(g) calculating the decay time $T_2^*$(i) from said spin-echo signal;

(h) repeating steps (a)–(g) for a plurality of field offset gradients g(i) where i=1 ... n, n being an integer;

(i) for each g(i) determining the value $T_2^*$(i);

(j) selecting the largest value of $T_2^*$(i)=$T_2^*$(max);

(k) adjusting the magnetic field offset gradient in said selected direction such that a field offset gradient g(max) is added to the static magnetic field $B_0$ wherein the field offset gradient g(max) is the value of g(i) which corresponds to $T_2^*$(max); and (l) performing nuclear magnetic resonance imaging utilizing the field offset gradient g(max) in addition to encoding field gradients perpendicular to said first axis.

BRIEF DESCRIPTION OF THE DRAWINGS

The features of the invention believed to be novel are set forth with particularly in the appended claims. The arrangement and operation of the invention, together with further objects and advantages thereof, may be more fully understood by reference to the following description taken in conjunction with the accompanying drawings in which:

FIGS. 6A and 6B depict NMR pulse sequences in accordance with the invention for determining the maximum value of $T_2^*$.

DETAILED DESCRIPTION OF THE PREFERRED EMBODIMENTS

Figure 1:
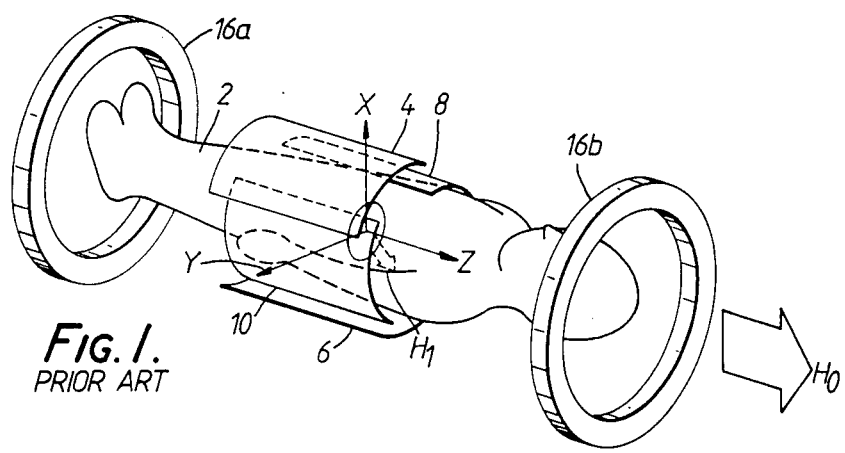
FIG. 1 diagrammatically illustrates the location of a target within the magnetic field generating coils.

Referring to FIG. 1, a target or object 2 to be investigated is placed in a static magnetic field $B_0$ which extends in the Z-direction. RF transmitter coils 4 and 6 and receiver RF coils 8 and 10 are shown, for example, to consist of two separate coil sets that are electrically orthogonal to one another and which generate RF magnetic field pulses having the required modulation to excite resonance in a planar slice of the object defined by the application of the magnetic field gradient $G_z$ along the Z-direction produced by Z-axis gradient coils 16a and 16b. RF magnetic field pulses are directed orthogonal to the $B_0$ field. The Z-axis gradient coils 16a and 16b are in the form of a Helmholtz pair wound in opposition, and are disposed substantially in planes perpendicular to the Z axis. In addition to $G_z$ gradient coils 16a and 16b, another two gradient coil sets are necessary to provide gradients $G_x$, and $G_y$, respectively for encoding spatial information in the X-axis and Y-axis directions orthogonal to the Z-axis direction. For the sake of clarity, the $G_x$ and $G_y$ gradient coil sets are only shown schematically as 16c, 16d and 16e, 16f respectively in FIG. 2, but are shown, in more detail for example, in the U.S. Pat. Nos. 4,254,778, 4,422,042 and 4,509,011, the whole of which documents are incorporated herein by reference.

Figure 2:
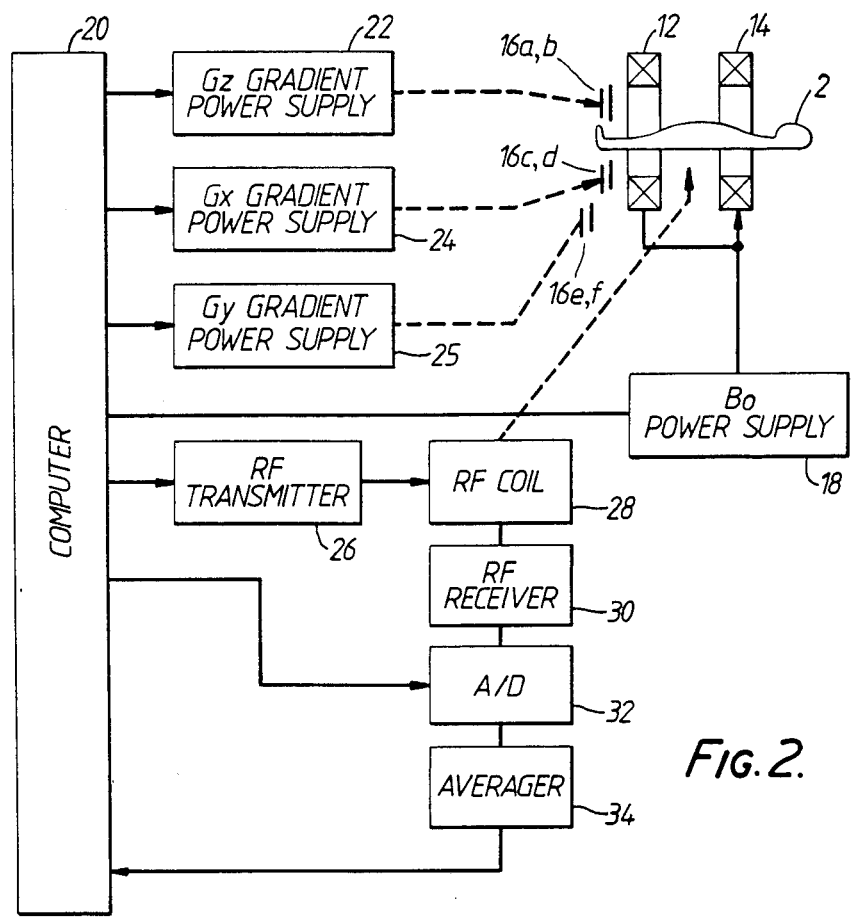
FIG. 2 is a simplified block diagram of the major components of NMR imaging apparatus of the subject invention.

In further consideration the major components of NMR imaging system with reference to FIG. 2, the object 2 is disposed in a uniform stable magnetic field $B_0$ (static field) generated by a magnet which is constituted by a set of two coaxial coils 12 and 14 provided by a power supply 18. It is convenient to define a Cartesian coordinate system with its Z axis coincident with the axis of the coils 16a and 16b. (In general, however, the Z axis may be selected to be any one of first, second and third axes). A 90° RF pulse will cause a nuclear magnetization $H_1$ (FIG. 1) for a particular proton to rotate into the transverse plane defined by the X- and Y-axis. The two coils 16a, 16b are energized with a current derived from a power supply 22 so as to generate a systematically varying linear field gradient in the Z direction. The magnetic field power supply source 22 is coupled to a general purpose computer 20 such as a minicomputer. Gradient power supplies 24 and 25 for energizing, respectively, $G_x$, and $G_y$ gradient coils 16c, 16d and 16e, 16f are also coupled to computer 20. RF transmitter 26 is gated with pulses from computer 20. Transmitter 26 comprises a RF signal generator and variable gain amplifier, and is coupled to the transmitter coils 4 and 6 of the transmitter and receiver RF coils 8 and 10. (In FIG. 2 the whole assembly comprising the elements 4, 6, 8 and 10 is denoted by the general coil set reference 28). The receiver coils 8 and 10 of coil set 28 are coupled to a RF receiver 30 comprising an amplifier, two phase-sensitive detectors, phase shifters, and low-pass filters. The NMR signal, which may be a FID signal or its echo signal, is applied to the two identical phase-sensitive detectors via the amplifier. Outputs from the phase shifters corresponding to a predetermined signal provides the reference signals for the detectors so that they operate in phase quadrature. The outputs of the detectors are respectively fed via identical low pass filters, to an analogue-to-digital (A/D) converter 32 to be digitized. The digitized signals from A/D converter 32 are supplied to signal averager 34, and the digital output from averager 34 is processed in computer 20 in order to develop image data. Computer 20 provides gating and envelope modulation for the NMR pulses, blanking for the RF transmitter and RF receiver, voltage waveforms for the gradient power supplies and advances gradient amplitudes, and the frequency of RF pulses. The computer also performs data processing such as Fourier transforms, image reconstruction, data filtering, imaging display, and storage functions in a conventional manner. Reference may also be made to the above-mentioned U.S. patents and to copending application Ser. No. 603,726 by Fumetoshi Kojima and Masahiko Hatanaka for more details of these conventional processing techniques.

Although the apparatus shown in FIG. 2 is conveniently used to provide NMR imaging information, it is also used to provide the offset field gradients in accordance with the invention by applying offset currents to the gradient coils 16a–16f using the gradient power supplies 22, 24 and 25.

Figure 3:
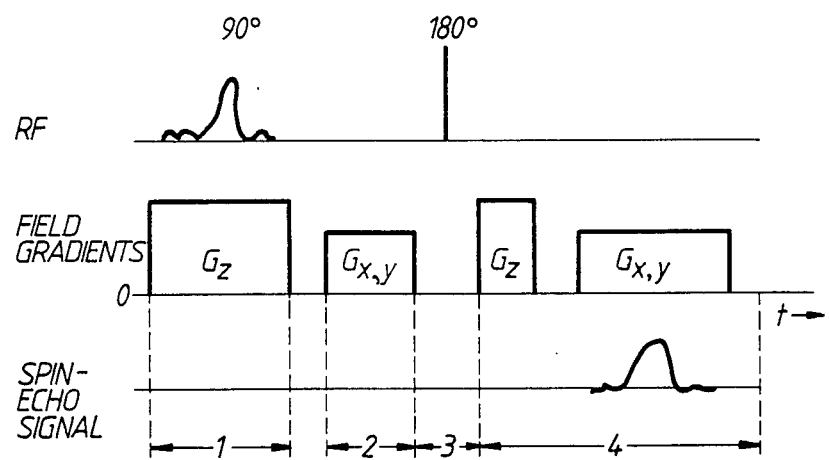
FIG. 3 depicts a NMR pulse sequences of the prior art for obtaining NMR imaging data from a planar slice of the target.

Reference is now made to FIG. 3 which depicts a prior art NMR pulse sequence suitable for performing planar imaging. In interval 1, shown along the horizontal axis of FIG. 3, nuclear spins situated in a planar slice of the object are selectively excited by the application of a selective 90° RF pulse in the presence of a positive magnetic field gradient $G_z$, as identified along the vertical axis.

Spatial information is phase encoded into the free induction decay (FID) NMR signal (not shown) occurring after the end of the 90° RF pulse by the application in interval 2 of the spatial encoding gradients $G_x$ and $G_y$. (In FIG. 3 the combination of $G_x$ and $G_y$ gradient amplitudes produce a resultant encoding gradient $G_{xy}$.) Following the application of the $G_x$ and $G_y$ gradients in interval 2, a nonselective 180° RF pulse is applied in interval 3 to invert the nuclear spins so as to produce a delayed spin echo signal in interval 4. The advantage of this technique is that the entire spin echo signal may be observed in interval 4 for a period of time when the $G_x$ and $G_y$ gradient coil currents have subsided and thus do not interfere with the FID signal. Additionally, in interval 4 gradient $G_z$ is applied after the 180° pulse, and a resultant $G_{xy}$ gradient is applied in order to reduce nuclear spin phase dispersion. Selective or tailored excitation of this type is further described in U.S. Pat. No. 4,021,726 incorporated herein by reference.

For the purpose of improving the signal-to-noise ratio, this process may be repeated several times so that the spin echo signals obtained in interval 4 are averaged in the averager 34.

Figure 4:
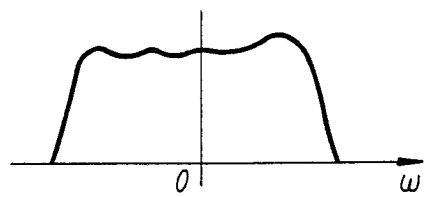
FIG. 4 illustrates a spectrum of Fourier transform of NMR signals in a projection orthogonal to the magnetic field gradient.

To produce NMR imaging based upon the received signals from the object, known two dimensional Fourier transform methods may be employed. Fourier transformation with respect to each of $G_x$ and $G_y$ encoding gradients yields the desired spatial distribution information of the spin density for particular protons. The Fourier transform that is obtained from the averaged spin echo signal corresponds to the projection profile of the object along a line in one direction as shown in FIG. 4. In order to obtain additional projections, the amplitudes of the encoding $G_x$ and $G_y$ gradient are changed so as to obtain a resultant $G_{xy}$ encoding gradient having a different orientation. After all of the projections are obtained, an NMR image may be reconstructed using, for example, known Fourier imaging methods.

Turning now to consider the case in which the NMR spin echo signal is used for correction of the inhomogeneity of the magnetic field intensity, the NMR signal is observed in the absence of magnetic field encoding gradients which provide spatial distribution information of the nuclear spin density, and the sequence for obtaining the NMR signal is carrier out with a field offset (which may be positive or negative) which is added to the $G_z$ gradient.

Figure 5:
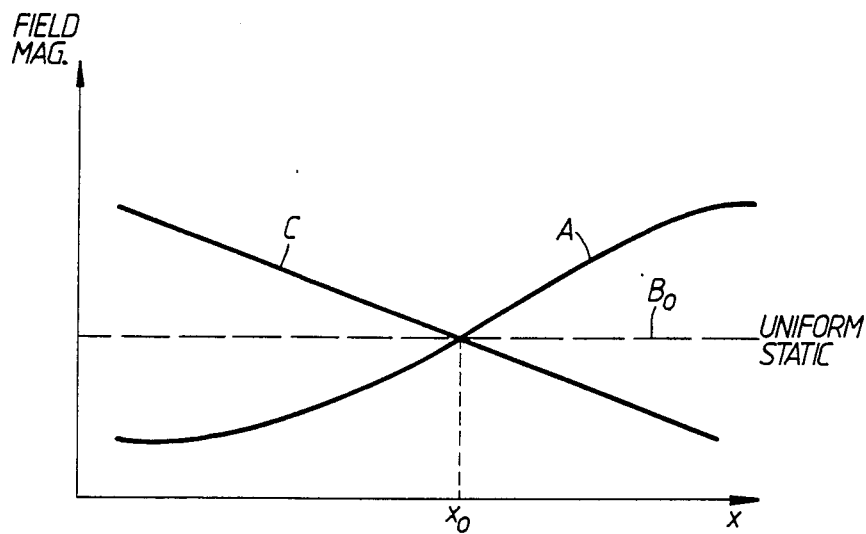
FIG. 5 illustrates a graph of the magnetic field inhomogeneity and the offset field gradient for compensating same.

FIG. 5 illustrates the static field inhomogeneity in line A and the ideal homogeneous static field in line B. In FIG. 5, the field magnitude is plotted as a function of x displacement where $x_0$ represents the center of the imaging region. It may be seen that static field inhomogeneities generally occur at the ends of the sample or target position. In accordance with the teachings of the invention, a magnetic offset gradient $g_x$ is applied along the X axis to compensate for the static field inhomogeneities. This offset gradient is represented in FIG. 5 by the line C. The offset gradient $g_x$ is supplied by passing a current through the coils 16c 16d via the $G_x$ power supply 24. The amount of current is determined in accordance with the algorithm set forth more fully below wherein the deacy time $T_2^*$ is maximized. Although FIG. 5 illustrates only the x axis inhomogeneity, it will be appreciated that y and z axis inhomogeneities may be taken into consideration using field offset gradients in the y and z directions supplied by passing offset currents through the coils 16e–16f and 16a–16b respectively. For each direction the offset field is in the z direction although the field offset gradients are in the x, y and z directions corresponding to offset gradients $g_x$, $g_y$ and $g_z$ respectively. In each case it is desired to select the offset gradient to compensate or "offset" the pure $B_0$ inhomogeneity, so that the offset gradient curve C appears as a linear reflection of the $B_0$ inhomogeneity about the ideal, uniform static $B_0$ field shown in line B.

Figure 6A:
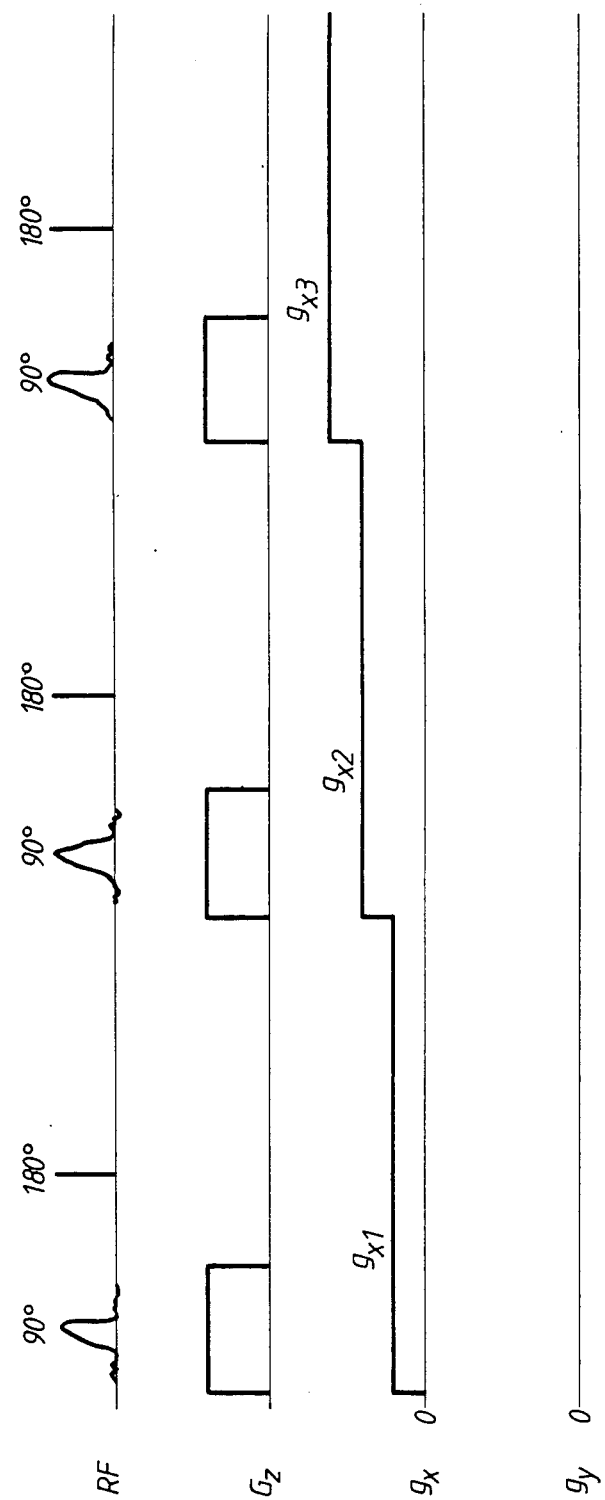

The procedure used to determine the field offset gradients may be illustrated in reference to FIGS. 6A and 6B. In FIG. 6A, the field offset gradient $g_x$ is determined. A 90° RF pulse is applied in the presence of the gradient field $G_z$ to select a particular slice in the target in a x, y plane perpendicular to the z axis. The orthogonal y gradient is maintained at zero and a small offset gradient $g_{x1}$ is applied in the x direction. (In principle, $g_y$ may be non-zero but is, at any event, maintained constant while $g_x$ is stepwise varied). After application of the non-selective 180° RF pulse, the spin-echo signal is observed while maintaining the offset gradient $g_x$ at its initial value, $g_{x1}$. The decay time $T_2^*$ is calculated in computer 20 (FIG. 2) from the observed spin-echo signal and is stored in computer 20 in association with the offset gradient value $g_{x1}$. This decay time $T_2^*$ is the conventional spin-spin decay or relaxation time and may be termed $T_2^*(x1)$ to indicate its association with $g_{x1}$. After measurement of the first decay time $T_2^*(x1)$, a second 90° selective RF pulse is applied under the influence of a second offset gradient $g_{x2}$ and subsequently a non-selective 180° RF pulse is applied to cause generation of the second spin-echo signal. The decay time $T_2^*(x2)$ for this spin-echo signal is calculated and stored in association with its corresponding offset gradient $g_{x2}$. In this manner, a plurality of decay times $T_2^*(i)$, $i=1,2 \ldots n$ (n being an integer) are determined and stored in association with the corresponding offset gradients $g(i)$ for the given gradient direction x.

In accordance with the teachings of the invention, the largest value of the decay times $T_2^*(i)$ is selected together with its associated offset gradient value. These parameters may be termed $T_2^*(x-max)$ and $g(x-max)$ respectively for the x direction. The procedure is repeated holding $g_x = 0$ while varying $g_y$ as shown in FIG. 6B. In this manner the static field spatial inhomogeneity in the x-y plane may be compensated by the values $g(x-max)$, $g(y-max)$ at any selected position along the z axis. The selected offset gradient values $g(x-max)$, $g(y-max)$ are then added to the conventional encoding gradients $G_x$, $G_y$ respectively in performing the conventional NMR imaging of FIG. 3 as shown in FIG. 7.

The process set forth above may also be used to compensate for $B_0$ inhomogeneities in the y,z and x,z planes wherein initial slicing gradients $G_x$ and $G_y$ are used respectively. Thus in FIGS. 6A and 6B the slicing gradient is $G_z$, and this gradient may be replaced with an object slicing gradient $G_x$ with orthogonal field offset gradients $g_y$ and $g_z$; and subsequently with an object slicing gradient $G_y$ with orthogonal field offset gradients $g_x$, $g_z$. The determined maximum values of $T_2^*$ are, in each case, used to find the corresponding values of the offset gradients. These field offset gradients in each direction may be repeatedly measured and then be averaged to find the average value of the field offset gradients $g_x(AV)$, $g_y(AV)$ and $g_z(AV)$.

Figure 7:
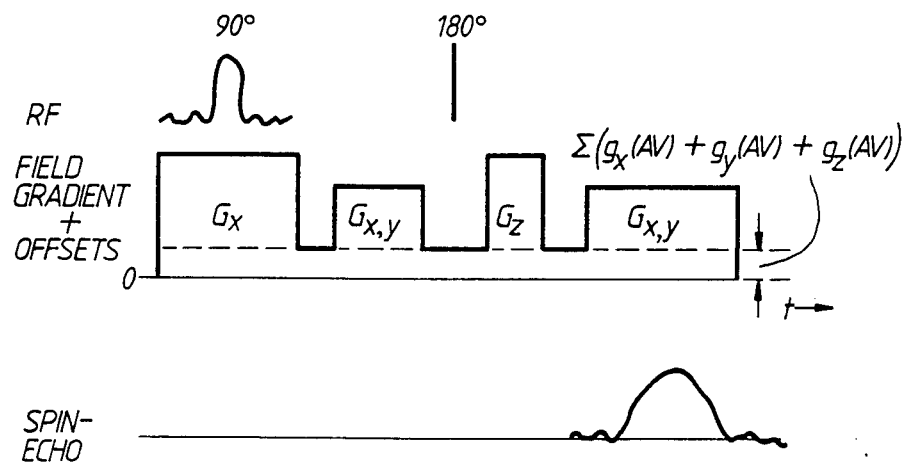
FIG. 7 illustrates the utilization of the offset field gradients in NMR imaging.

As illustrated in FIG. 7, the NMR imaging process is carried out as per FIG. 3 with the exception that the field offset gradients $g(x-max)$, $g(y-max)$ and $g(z-max)$ or their average values $g_x(AV)$, $g_y(AV)$ and $g_z(AV)$ are used as field offset gradients added to the normal slicing gradient $G_z$ and normal encoding gradients $G_x$, $G_y$ so as to eliminate or at least compensate for the effects of static field inhomogeneity.

It is believed that the determination of offset gradients corresponding to the maximum value of $T_2^*$ is effective for compensating for static field inhomogeneities because the static field inhomogeneities produce additional dephasing which hastens the decay of the NMR signal. This dephasing results from the fact that nuclear spins in different spatial positions are exposed to slightly different magnetic field values and hence resonate at slightly different frequencies. Maximizing $T_2^*$ maximizes the decay which corresponds to a minimum field inhomogeneity. Thus, the offset gradient which corresponds to a maximum $T_2^*$ also corresponds to a minimum field inhomogeneity.

It is understood that the principles of the invention are not restricted to the precise pulse sequences shown in FIGS. 3 and 7 but the offset currents, once determined, may be used in numerous other variations of NMR image sequences.

While this invention has been described with reference to particular embodiments and examples, other modifications and variations will occur to those skilled in the art in view of the above teachings. Accordingly, it should be understood that within the scope of the appended claims the invention may be practiced otherwise than is specifically described.

What is claimed is:

1. An apparatus for performing nuclear magnetic resonance imaging of an object and compensating for static field inhomogeneities comprising:
   (a) means for applying a static magnetic field to said object along a first axis thereof;
   (b) means for applying a first magnetic field gradient $G_z$ along a selected one of said first, second and third axes;
   (c) means for applying second and third mutually orthogonal field gradients $G_x$, $G_y$ along directions perpendicular to said selected axis;
   (d) means for applying radio frequency signals to excite a selected region of said object in a plane perpendicular to said first axis and for providing an NMR spin-echo signal;
   (e) means for varying the magnitude of at least the $G_x$ and $G_y$ magnetic field gradients for producing a varying orientation of a composite gradient in the plane containing said selected region;
   (f) means for detecting said NMR spin-echo signal for different orientations of said composite gradient to derive imaging data of said selected regions;
   (g) means for applying a plurality of magnetic field offsets gradients $g_x$ in the direction of $G_x$ while detecting said NMR spin-echo signals in the absence of magnetic field gradients $G_y$;
   (h) means for applying a plurality of magnetic field offset gradients $g_y$ in the direction of $G_y$ while detecting said NMR spin-echo signals in the absence of magnetic field gradients $G_x$;
   (i) means for calculating the decay time $T_2^*$ for each of said plurality of magnetic field offset gradients $g_x$, $g_y$;
   (j) means for selecting the largest of said calculated values $T_2^*$ for each of said offset gradients $g_x$, $g_y$;
   (k) means for adjusting the magnetic field offset gradients $g_x$, $g_y$ to correspond to the largest selected values of $T_2^*$ for $g_x$, $g_y$ respectively; and
   (l) means for adding said offset field gradients $g_x$, $g_y$ to said field gradients $G_x$, $G_y$ for performing NMR imaging.

2. An apparatus for performing nuclear magnetic resonance imaging of an object and compensating for static field inhomogeneities comprising:
   (a) means for applying a static magnetic field to said object along a first axis thereof;
   (b) means for applying a first magnetic field gradient $G_z$ along a selected one of said first, second and third axes;
   (c) means for applying second and third mutually orthogonal field gradients $G_x$, $G_y$ along directions perpendicular to said selected axis;
   (d) means for applying radio frequency signals to excite a selected region of said object in a plane perpendicular to said first axis and for providing an NMR spin-echo signal;
   (e) means for varying the magnitude of at least the $G_x$ and $G_y$ magnetic field gradients for producing a varying orientation of a composite gradient in the plane containing said selected region;

(f) means for detecting said NMR spinecho signal for different orientations of said composite gradient to derive imaging data of said selected regions;

(g) means responsive to said decay time $T_2^*$ of said spin echo signal, for compensating for static magnetic field inhomogeneities, said means including means for apply field offset gradients having values which are functions of $T_2^*$.

3. A method for NMR image formation which compensates for static magnetic field inhomogeneities on nuclear spin-echo signals comprising the steps of:

(a) applying a gradient field $G_z$ along a chosen one of first, second and third axes of a sample;

(b) applying a static magnetic field $B_0$ along said first axis of a sample;

(c) irradiating said sample with a frequency selective 90° RF pulse so as to excite a plurality of nuclear spins in a predetermined region within said sample;

(d) irradiating said sample with a 180° RF pulse;

(e) applying a field offset gradient g(i) in a selected direction orthogonal to said chosen axis;

(f) detecting a spin-echo signal in the presence of said offset gradient g(i);

(g) calculating the decay time $T_2^*(i)$ from said spin-echo signal;

(h) repeating steps (a)–(g) for a plurality of offset fields g(i) where i = 1 ... n, n being an integer;

(i) for each g(i) determining the value $T_2^*(i)$;

(j) selecting the largest value of $T_2^*(i) = T_2^*(max)$;

(k) adjusting the magnetic field offset gradient in said selected direction such that offset gradient field g(max) is added to the static magnetic field $B_0$ wherein the field offset gradient g(max) is the value of g(i) which corresponds to $T_2^*(max)$; and (l) performing nuclear magnetic resonance imaging utilizing the field offset gradient g(max) in addition to encoding gradients perpendicular to said chosen axis.

4. A method for NMR image formation which compensates for static magnetic field inhomogeneities on nuclear spin-echo information comprising the steps of:

(a) applying a gradient field $G_z$ along a chosen one of first, second and third axes of a sample;

(b) applying a static magnetic field $B_0$ along said first axis of a sample;

(c) irradiating said sample with a frequency selective 90° RF pulse so as to excite a plurality of nuclear spins in a predetermined region within said sample;

(d) irradiating said sample with a 180° RF pulse;

(e) applying a field offset gradient g(i) in a selected direction orthogenal to said chosen axis;

(f) detecting a spin-echo signal in the presence of said offset gradient g(i);

(g) calculating the decay time $T_2^*(i)$ from said spin-echo signal;

(h) adjusting the magnetic field such that said field offset gradient is added to the static magnetic field, the value of said field offset gradient g(i) determined as a function of the decay time $T_2^*$; and (i) performing NMR imaging utilizing the field offset gradient g(i) in addition to encoding gradient fields perpendicular to said first axis.

* * * * *